(12) United States Patent
Mann

(10) Patent No.: US 8,134,515 B2
(45) Date of Patent: Mar. 13, 2012

(54) FEEDHORN ASSEMBLY AND METHOD OF FABRICATION THEREOF

(75) Inventor: Christopher Mark Mann, Cornwall (GB)

(73) Assignee: ThruVision Systems Limited, Abingdon, Oxfordshire (GB)

( * ) Notice: Subject to any disclaimer, the term of this patent is extended or adjusted under 35 U.S.C. 154(b) by 343 days.

(21) Appl. No.: 12/298,360

(22) PCT Filed: Apr. 25, 2007

(86) PCT No.: PCT/GB2007/001525
§ 371 (c)(1),
(2), (4) Date: Nov. 13, 2008

(87) PCT Pub. No.: WO2007/122413
PCT Pub. Date: Nov. 1, 2007

(65) Prior Publication Data
US 2009/0115676 A1    May 7, 2009

Related U.S. Application Data

(60) Provisional application No. 60/794,732, filed on Apr. 25, 2006.

(30) Foreign Application Priority Data

Jul. 29, 2006   (GB) .................................. 0615140.1

(51) Int. Cl.
*H01Q 13/00*    (2006.01)
*H01Q 3/00*    (2006.01)
(52) U.S. Cl. ......... 343/786; 343/772; 343/762; 343/771
(58) Field of Classification Search .................. 343/761, 343/755, 910, 704, 765, 766, 772, 781 R, 343/779, 781 P, 878, 756, 781 CA, 757, 786; 333/24.3, 126, 137, 212, 21 A, 208; 385/88, 147, 50, 2, 14, 30, 37, 24, 84
See application file for complete search history.

(56) References Cited

U.S. PATENT DOCUMENTS
650,448 A    5/1900    Beebe
(Continued)

FOREIGN PATENT DOCUMENTS
EP    0 262 590    4/1988
(Continued)

OTHER PUBLICATIONS
International Search Report for PCT/GB2007/001525, mailed Jul. 26, 2007.
(Continued)

*Primary Examiner* — Trinh Dinh
(74) *Attorney, Agent, or Firm* — Nixon & Vanderhye PC

(57) ABSTRACT

An array of feedhorns feeds detected radiation through waveguides to diode-based mixers to produce modulated intermediate frequency ("IF") signals. The mixers and waveguides are accommodated on a substrate surface and multiple substrates can be layered up to support a two-dimensional array of waveguide openings in a face of a waveguide/mixer block. A feedhorn block is brought into register with this face so that each waveguide opening connects with a feedhorn. An end portion of each feedhorn is drilled into the opening of a respective waveguide. The main feedhorn block and the waveguide/mixer block are then assembled into registration. This method of construction avoids transverse interfaces in the walls of the feedhorns or waveguides just at the point where the transition is made from one to another.

15 Claims, 5 Drawing Sheets

U.S. PATENT DOCUMENTS

| | | | |
|---|---|---|---|
| 4,048,568 A | | 9/1977 | Rast, Jr. et al. |
| 4,356,495 A | * | 10/1982 | Morz ........................... 343/786 |
| 4,406,020 A | | 9/1983 | Reindel |
| 4,760,404 A | * | 7/1988 | Ramsey ........................ 343/786 |
| 5,023,866 A | | 6/1991 | DeMuro |
| 2003/0128932 A1 | * | 7/2003 | Samiec et al. ................. 385/50 |
| 2003/0160662 A1 | | 8/2003 | Chang et al. |
| 2005/0020231 A1 | | 1/2005 | Yamada et al. |
| 2005/0212712 A1 | * | 9/2005 | Pryor et al. ................... 343/786 |

FOREIGN PATENT DOCUMENTS

| | | |
|---|---|---|
| GB | 761762 A | 11/1956 |
| JP | 09018363 A | 1/1997 |
| JP | 2001 094334 | 4/2001 |
| WO | 2004/038854 | 5/2004 |

OTHER PUBLICATIONS

Written Opinion of the International Searching Authority for PCT/GB2007/001525, mailed Jul. 26, 2007.

Smith, C. et al., "Development of a Multi-Layer SU-8 Proces for Terahertz Frequency Waveguide Blocks", Microwave Symposium Digest, pp. 439-442, (Jun. 12, 2005).

Sehm, T. et al., "Planar 64 Element Millimetre Wave Antenna", Electronics Letters, vol. 35, No. 4, pp. 253-255, (Feb. 18, 1999).

Kittara, P. et al., "A 700-GHZ SIS Antipodal Finline Mixer Fed by a Pickett-Potter Horn-Reflector Antenna", IEEE Transactions on Microwave Theory and Techniques, vol. 52, No. 10, pp. 2353-2360, (Oct. 2004).

* cited by examiner

FIGURE 3
FIGURE 4
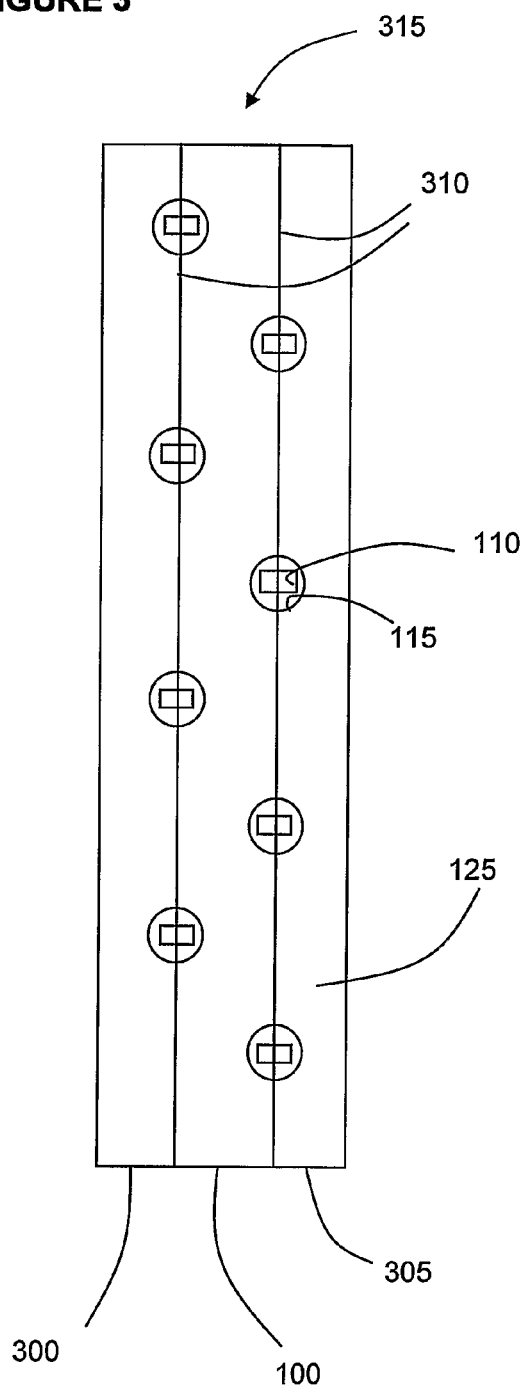
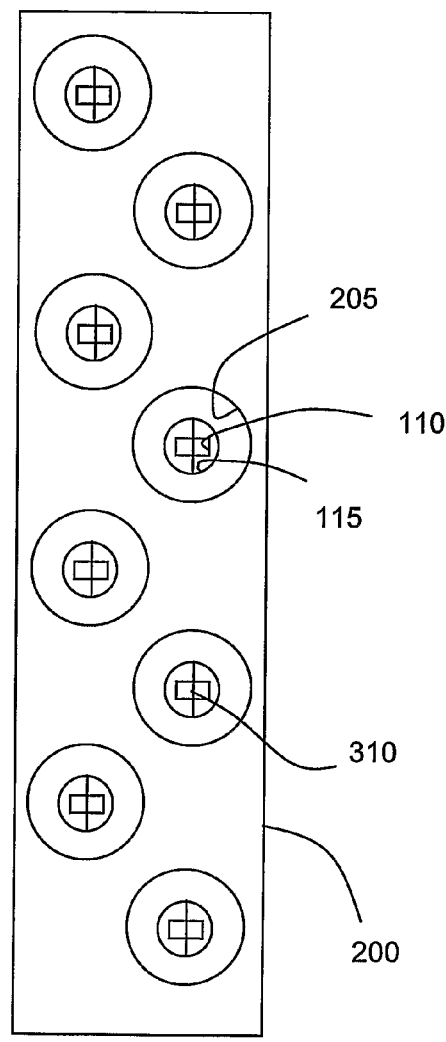

FEEDHORN ASSEMBLY AND METHOD OF FABRICATION THEREOF

This application is the U.S. national phase of International Application No. PCT/GB2007/001525, filed 25 Apr. 2007, which designated the U.S. and claims the benefit of U.S. Provisional Application No. 60/794,732, filed 25 Apr. 2006, and claims priority to Great Britain Application No. 0615140.1, filed 29 Jul. 2006, the entire contents of each of which are hereby incorporated by reference.

TECHNICAL FIELD

The present invention relates to a feedhorn assembly for use in detecting objects using the electromagnetic spectrum at wavelengths in the centimeter to sub-millimeter range and to a method of fabrication thereof.

Embodiments of the invention are relevant from the microwave to the terahertz region of the electromagnetic spectrum. However, the terahertz region has particular benefit for many applications in offering high resolution in small systems and specific embodiments of the invention are described below which operate in the terahertz region. "Terahertz" in this context means the electromagnetic spectrum at wavelengths in the millimeter to sub-millimeter range.

RELATED ART

It is known to use a mixer and local oscillator to transmit or receive electromagnetic radiation. Arrangements using a local oscillator include for example super heterodyne, heterodyne, homodyne or direct IF ("intermediate frequency") detection and the use of direct amplification for detection where the amplifier is configured as a regenerative or self oscillating mixer.

(In heterodyne detection at wavelengths in the centimeter to sub-millimeter range, the local oscillator is frequency-shifted with respect to the incoming signal to be detected while in homodyne detection it has the same frequency.)

The range mentioned above is referred to herein generally as the terahertz spectrum. Terahertz radiation has been found a useful tool for imaging and other purposes because some materials are transparent to it which are opaque through the visible spectrum. This allows these materials to be "seen through" using terahertz radiation where they could not using visible optical radiation. For example, terahertz wavelengths have been used in imaging the earth's surface through the atmosphere and for improving visibility in bad weather (for example for flying or driving). Some materials can be distinguished under terahertz radiation because of their distinctive transmissivity or reflectivity and this has been used for example in detecting food or chemical components. Further, objects themselves can emit terahertz radiation, including the human body. This has been used for example in medicine for detecting skin cancer. Because clothing is generally transparent to terahertz radiation but weaponry is not, another application has been the detection of weaponry otherwise concealed about the person.

Cameras for imaging an object by use of the terahertz ("THz") spectrum are known. For example, an arrangement is described in International Patent Application WO 2004038854 in the name Agence Spatiale Européenne. In this arrangement, the camera is based on a double bank of feedhorns which each pick up terahertz radiation, in use, which is directed into a mixer channel to extract an intermediate frequency signal using a local oscillator. This known heterodyne technique allows smaller detectors to be used at room temperature in the terahertz range than might otherwise be necessary and so supports finer resolution.

The detectors of WO 2004038854 are constructed using a pair of substrates, at least one of which is patterned to accommodate, for each detector, the antenna, a mixer channel and a via through the substrate to a signal output. A waveguide is coupled to the mixer channel to deliver a signal from the local oscillator. In the finished camera, the two substrates lie face to face in a sandwich arrangement so that the patterning accommodating the detector construction is between the substrates and protected thereby.

The feedhorns deliver received radiation to the mixer channel via a second waveguide coupled to the mixer channel. The feedhorns however have a significantly different cross section from that of the waveguide, this being circular compared with oblong. These different cross sections lend themselves to different fabrication techniques and, at least partly for this reason, the feedhorns and the waveguides have in the past been made separately and then assembled.

BRIEF SUMMARY

According to a first aspect of embodiments of the present invention, there is provided a waveguide/feedhorn assembly for use in a mixer-based electromagnetic radiation detector, the assembly comprising a block of material having at least part of a waveguide therein and at least part of a feedhorn, the feedhorn and the waveguide having a junction therebetween for delivery of radiation, wherein the junction is inset from a surface of the block of material such that material of the block is continuous in the waveguiding direction of the waveguide across the junction.

Embodiments of the invention have been found to offer very good performance while being relatively easy to make.

It is not obvious to one skilled in the art of making electromagnetic radiation detectors based on a mixer and local oscillator to attempt to construct a feedhorn/waveguide junction which is embedded inside a block of material. This is particularly because of the requirements for the feedhorn, the waveguide and the coupling of the waveguide to a mixer channel.

The feedhorn generally needs to have a rounded, often an accurately circular, cross section and can be made by drilling or the like.

The waveguide however may have a quadrilateral cross section which cannot be made by drilling. The waveguide may be constructed using any suitable technique but a convenient technique is described in co-pending British patent application 0615140.1, filed 29 Jul. 2006. The waveguide block as described therein has a sandwich construction, being made from two or more substrates. Each waveguide is constructed as an elongate recess in the surface of one or both of a pair of substrates, these surfaces then being brought together to create a waveguide which is effectively a hole of rectangular cross section through the waveguide block.

The coupling of each waveguide to the mixer channel is done by means of an antenna which has to sit, in use, in the waveguide. The "sandwich" technique described above can also be used to provide a chamber for the mixer channel. Before the substrates are brought together, a mixer and its antennas are mounted in the chamber. When the substrates are now brought together, the mixer is already in place in relation to the local oscillator and received radiation waveguides, coupled by means of the antennas.

Because of the significant difference in fabrication technique for the feedhorn compared with the waveguide and mixer channel, a feedhorn block has been drilled and then brought into registration with a waveguide block, the waveguide block having a sandwich construction as described above. However, it has been found in making the present invention that significant improvement in performance can be achieved by using a construction in which the junction between a feedhorn and its waveguide is provided by a continuous surface in the waveguiding direction.

Although it may be possible to construct a whole feedhorn between the junction and the surface of the block of material, this can bring risks. The functional requirements of the feedhorn usually mean that it will be constructed by drilling. However, by the time the waveguide has been completed, it already contains an antenna coupling to the mixer channel and is in direct communication with the mixer chamber. These are delicate structures, easily damaged for instance by swarf from a drilling operation to create a feedhorn.

According to a second aspect of embodiments of the invention, there is provided a waveguide/feedhorn assembly for use in a mixer-based electromagnetic radiation detector, the assembly comprising:
  i) a waveguide block having at least part of a waveguide therein; and
  ii) a feedhorn block having at least part of a feedhorn therein,
the feedhorn block being assembled with the waveguide block such that said part of a feedhorn communicates with said part of a waveguide for delivery of radiation therebetween,
wherein the waveguide block comprises an end portion of the feedhorn through which said delivery takes place in use of the assembly.

The feedhorn may be fabricated for example by a method including the step of drilling into the waveguide block at the location of the at least part of a waveguide to create the end portion of the feedhorn. The main body of the feedhorn may be constructed by drilling through the feedhorn block. The end portion of the feedhorn and its main body can then be brought into registration by assembling the waveguide and feedhorn blocks using a known alignment technique such as dowels.

In embodiments of the invention according to its second aspect, there is still no interface in material at the point where waveguide and feedhorn meet which is transverse to the direction of travel of radiation being delivered therebetween. The only transverse interface is set back from the end of the feedhorn where its end portion and its main body meet. It has been found that the interface causes significantly less loss here than at the junction between the waveguide and the feedhorn.

Embodiments of the invention according to its second aspect allow the main body of the feedhorn to be drilled into a seamless block of material and then brought into registration with its end portion which has been drilled into the waveguide block.

In practice, the presence of the transverse interface offset from the transition from the waveguide to the feedhorn can be used to advantage. For example, if there is a mismatch in the sizes of the openings to the end portion of the feedhorn in the waveguide block and to the main body of the feedhorn in the feedhorn block, a discontinuity is produced when the two parts of the feedhorn are brought into registration. This discontinuity can be used to produce more complex horn designs such as the known 'Potter' or 'mode matched' feedhorn.

According to a third aspect of embodiments of the present invention, there is provided a method of making a waveguide/feedhorn assembly for use in an electromagnetic radiation detector, which method comprises the steps of:
  i) making a waveguide block having at least one waveguide and at least one end portion of a feedhorn therein, said end portion communicating with the at least one waveguide for delivery of radiation therebetween in use of the assembly;
  ii) making a feedhorn block having at least one further portion of a feedhorn therein; and
  ii) assembling the feedhorn block with the waveguide block to provide at least one feedhorn comprising said end portion and said further portion.

Embodiments of the present invention lend themselves very well to the production of waveguide/feedhorn assemblies providing arrays of feedhorns for imaging purposes. In this case for example a feedhorn block may comprise an array of feedhorn apertures and the waveguide block comprise a matching array of waveguides, each feedhorn aperture communicating with a respective waveguide in the assembly.

Words such as "in register", or "registration", are used herein. Unless the context indicates otherwise, this generally means a pair of openings, such as recesses or apertures, is brought into matching alignment. Where the openings of a pair are of different sizes, registration can be achieved, for example, by centering one in relation to the other.

It is to be understood that any feature described in relation to any one embodiment may be used alone, or in combination with other features described, and may also be used in combination with one or more features of any other of the embodiments, or any combination of any other of the embodiments.

BRIEF DESCRIPTION OF THE DRAWINGS

A waveguide/feedhorn assembly for use in a mixer-based electromagnetic radiation detector will now be described as an embodiment of the present invention, by way of example only, with reference to the accompanying figures in which:

FIG. 3 shows a front elevation of a set of three substrates of the general type shown in FIG. 1 but brought together in a sandwich construction to complete the mixer channels, local oscillator feeds and waveguide connections;

FIG. 4 shows a front elevation of the main face of the feedhorn block of FIG. 2 after assembly with the structure of FIG. 3;

It should be noted that none of the figures is drawn to scale, the figures being schematic only. Like reference numerals are used to indicate like parts on different figures.

DETAILED DESCRIPTION OF EXEMPLARY EMBODIMENTS

Figure 1:
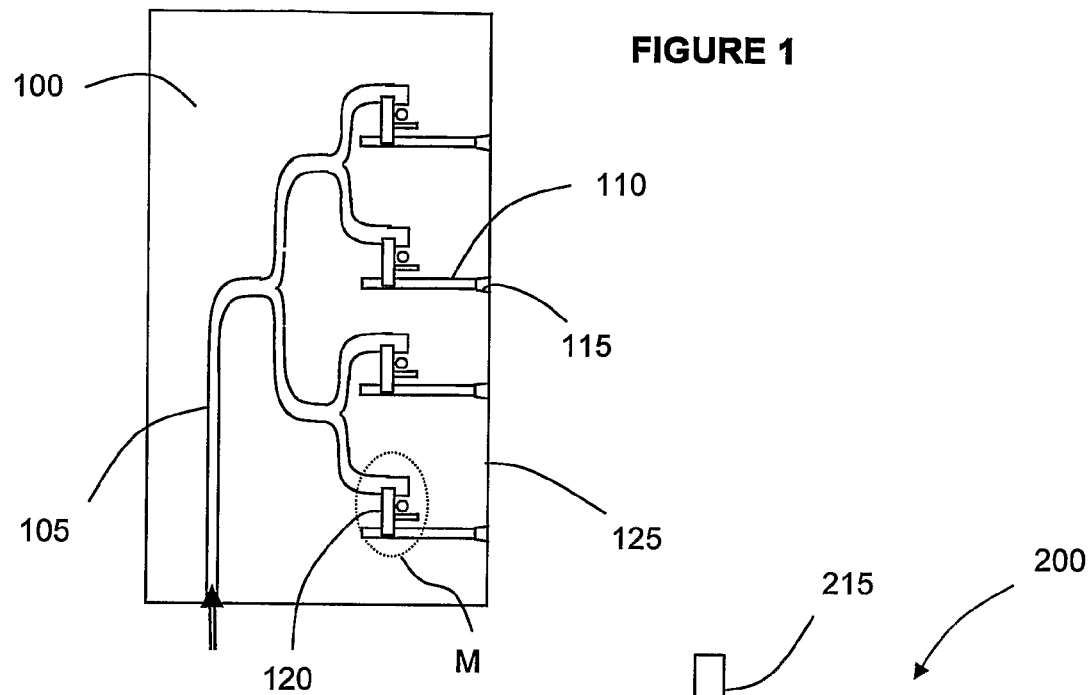
FIG. 1 shows schematically, in side elevation, a substrate for use in the assembly to support a set of mixer channels together with their local oscillator feeds and waveguide connections to end portions of feedhorns.

Referring to FIG. 1, the mixer-based electromagnetic radiation detector in general is of the type described in co-pending British patent application 0615140.1, filed on 29 Jul. 2006, the description of which is herein incorporated by reference. It comprises a mixer channel "M" which is provided in use with a local oscillator signal via a branched waveguide 105. Detected radiation is delivered to the mixer channel "M" via a second waveguide 110.

The mixer channel "M" is in practice provided by patterning on an elongate quartz substrate 120 which has a microstrip antenna at each end (not shown). Each antenna projects into a respective waveguide 105, 110.

Referring also to FIG. 3, the mixer channel "M" and its waveguides 105, 110 are carried between pairs of substrates 100, 300. The substrates 100, 300 each have the path of the waveguides 105, 110 etched or machined into their surface and further etching or machining provides a chamber (not shown) for the mixer channel "M". When pairs of substrates 100, 300 (and/or 100, 305) are brought together, this etching or machining is in register and provides the waveguides and chamber between the two substrates 100, 300. These each have a generally rectangular cross section.

As shown in FIG. 3, three or more of the substrates 300, 100, 305 can be stacked, providing a set of waveguides 105, 110 along the interface 310 between each pair of substrates. The stack of substrates provides what can be referred to as a waveguide block 315, although it also offers the chambers for the mixer channels "M". The cross section of the waveguides 105, 110 is such that the interface 310 appears in the longer sidewalls of each waveguide 105, 110, this generally being best practice.

The second waveguide 110 delivering received radiation to each mixer channel "M" opens to a common face 125 of the waveguide block 315. Importantly, at that face 125, each waveguide 110 has a short conical section 115 opening out to meet the face 125. These conical sections 115 can be drilled and they provide the transition from the rectangular cross section of the waveguides 110 to the circular cross section of a feedhorn.

Due to this sandwich-style construction of the waveguide block 315, opposing walls of the waveguides 105, 110 have a discontinuity running parallel to the waveguiding direction of the respective waveguide, created by the interface 310 between each pair of substrates. However, there is no discontinuity, either in the walls of the waveguides 105, 110 or at the transition from the rectangular cross section of the waveguides 110 to the circular cross section of the conical sections 115, which lies transverse to the waveguiding direction.

Figure 2:
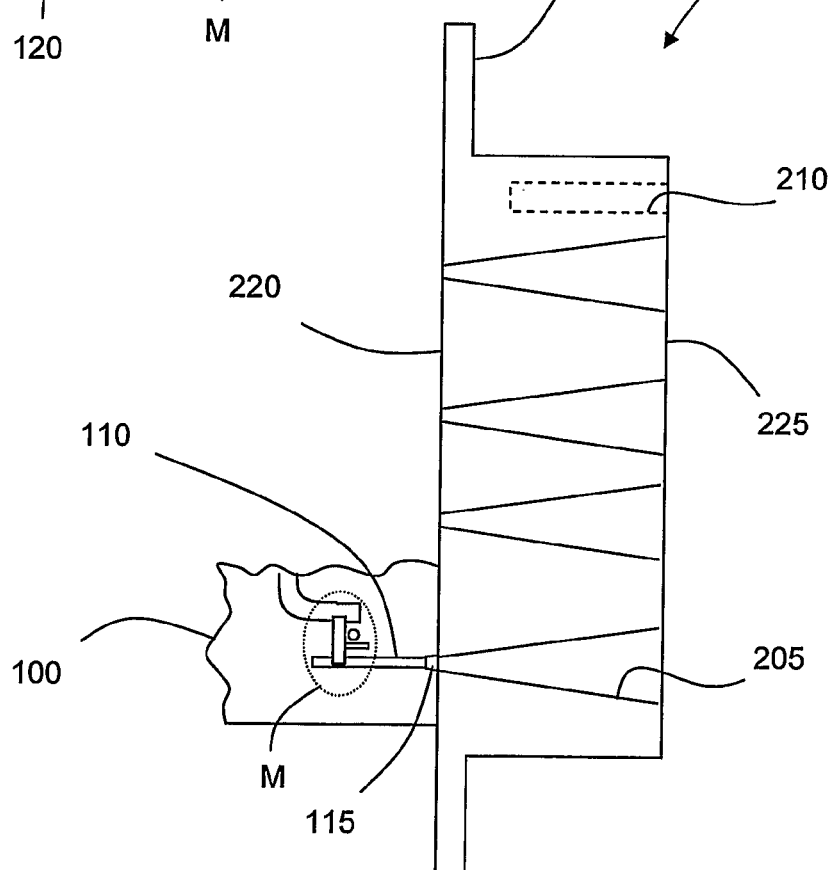
FIG. 2 shows a cross section through a feedhorn block providing the main bodies of feedhorns for assembling with the end portions shown in FIG. 1.

FIG. 2 shows a cross section through a feedhorn block 200. It also shows part of the substrate 100 shown in FIG. 1 in an assembled position against the feedhorn block 200 and in particular the alignment of a waveguide 110 and a conical end section 115 of a feedhorn on the substrate with the main body of a feedhorn 205 in the feedhorn block 200.

Referring to FIG. 2, apart from their end sections 115 the bulk of each feedhorn 205 is provided by drilling through a separate feedhorn block 200. The feedhorn block 200 is then mounted against the face 125 of the waveguide block 315 so that each conical end section 115 of a feedhorn connects to the rest of a feedhorn 205. Although this leaves a discontinuity in the wall of each feedhorn 205 not far from its end section 115, which discontinuity is transverse to the longitudinal axis of the feedhorn 205, it has been found that this is much less significant than a transverse discontinuity lying right at the transition from waveguide 110 to feedhorn 205.

Referring to FIG. 4, looking at the front elevation of the feedhorn block 200 when mounted against the face of the waveguide block 315, the sandwich-like construction of the waveguide block 315 is largely concealed. The interfaces 310 between neighbouring substrates can only be seen through the open end of each waveguide 110 and conical section 115.

Figure 5:
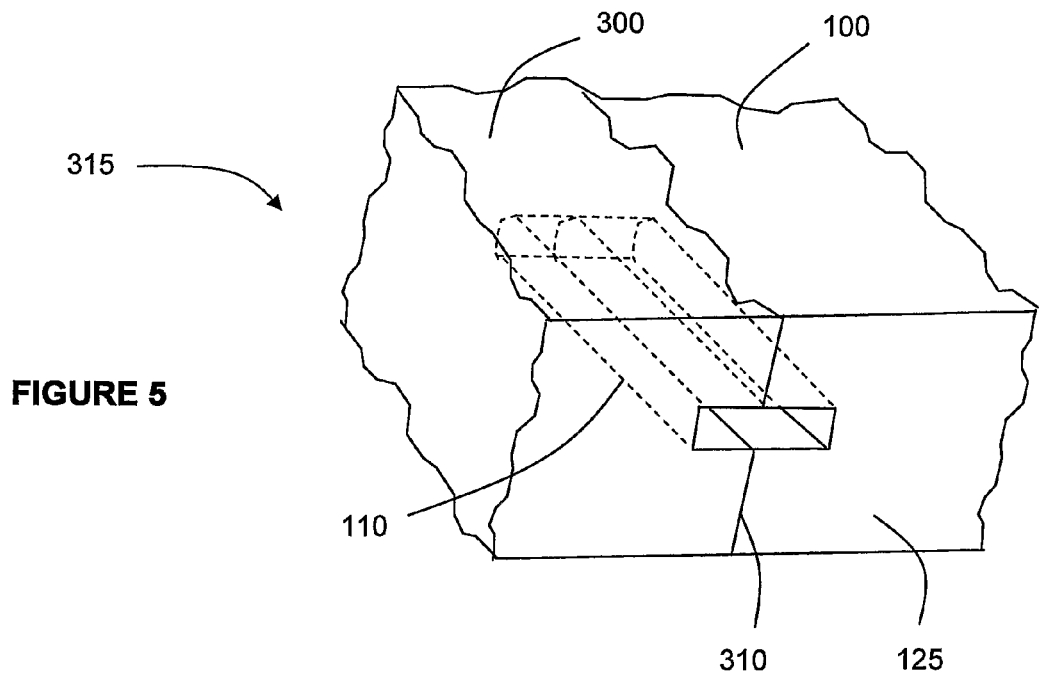
FIG. 5 shows an elevation in quarter view of a single waveguide during construction of the structure of FIG. 3.
Figure 6:
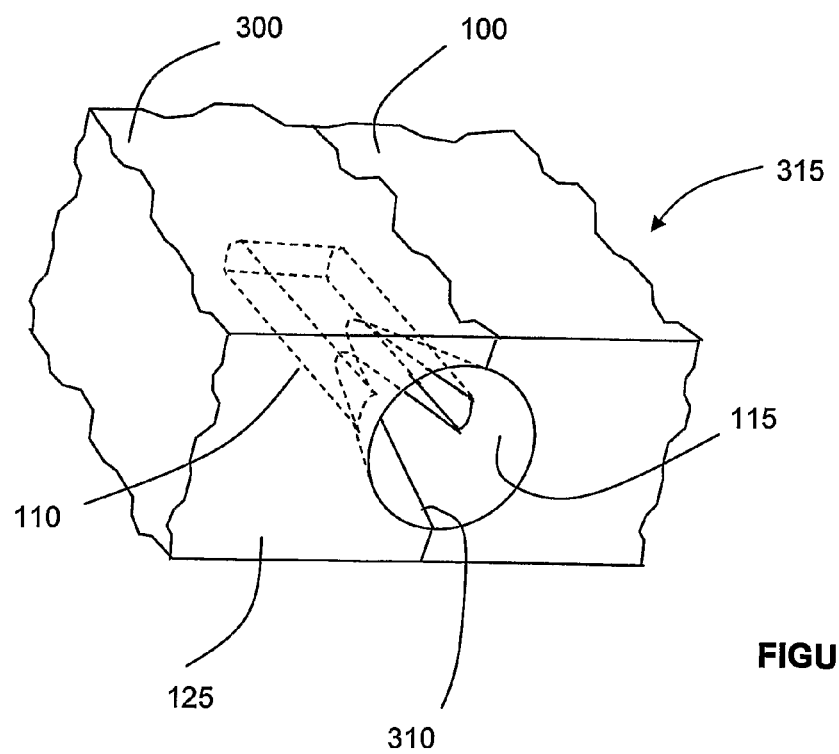
FIG. 6 shows the elevation of FIG. 5 after drilling of an end portion of a feedhorn into the waveguide.

Referring to FIGS. 5 and 6, the construction of a conical end section 115 for a feedhorn 205 can be seen in enlarged view. The opening of a waveguide 110 at the face 125 of the waveguide block 315 is simply drilled to create an aligned conical opening 205. As seen in FIG. 6, the wall of the conical opening 205 has two opposing discontinuities created by the interface 310 between two substrates 100, 305 of the waveguide block 315. However, these extend in an axial direction relative to the conical section 205.

There are balancing requirements concerning the length of the conical sections 205 of the feedhorns which are drilled into the waveguide block 315. These are that the transverse interface produced by the face 125 of the waveguide block 315 should be sufficiently spaced from the transition from waveguide 110 to feedhorn 205 for each feedhorn 205 to avoid compromising performance. On the other hand, the amount of drilling done into the waveguides 110 of the waveguide block 315 generally needs to be minimised to avoid damage such as swarf entering the waveguides 110. Thus although it may be possible to drill a whole feedhorn into the end of the waveguide 110 so that there is no transverse discontinuity at all in the wall of the waveguide 110 or feedhorn 205, it could then have a deleterious effect on quality control.

In practice, the distance from the face 125 of the waveguide block 315 to the transition from waveguide 110 to feedhorn 205 will be set by the feedhorn performance characteristics required. In a manufacturing method generally as described above, in which the conical end sections 115 of feedhorns 205 are drilled into the ends of waveguides 110, the length and feedhorn/waveguide spacing can be adjusted arbitrarily depending on the required array configuration and optics requirements.

Feedhorn technology is established and the overall dimensions chosen for the waveguides 110 and feedhorns 205 will generally be chosen in accordance with the expected application. An example of a book on the subject is "Antennas for All Applications", third edition, J. D. Kraus, R. J. Marhefka, published by McGraw-Hill in 2002. A feedhorn will generally discriminate in terms of the wavelength band of radiation it receives or transmits and its design therefore has to be tailored accordingly. An example for use with THz radiation might have a cross section which is 1.33 mm in diameter at its narrow end and 7.001 mm in diameter at its wide end, its walls being at an angle of 18.9° to each other.

The important dimensions of a feedhorn are generally the dimensions of the inner or "internal" surface of the feedhorn that will provide a boundary to travel of radiation in use of the feedhorn and thus references to dimensions, shapes, cross sections and sizes herein in relation to a feedhorn are generally references to this internal surface.

Figure 8:
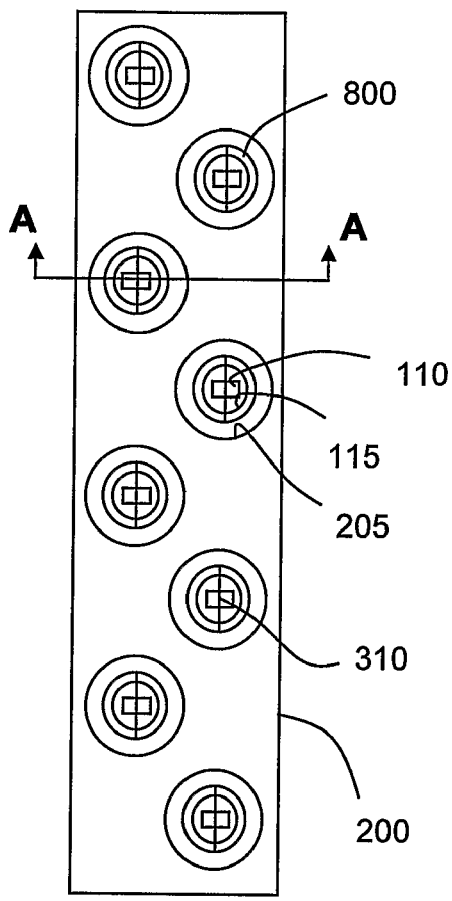
FIG. 8 shows a front elevation of a modified version of the feedhorn block of FIG. 4.
Figure 9:
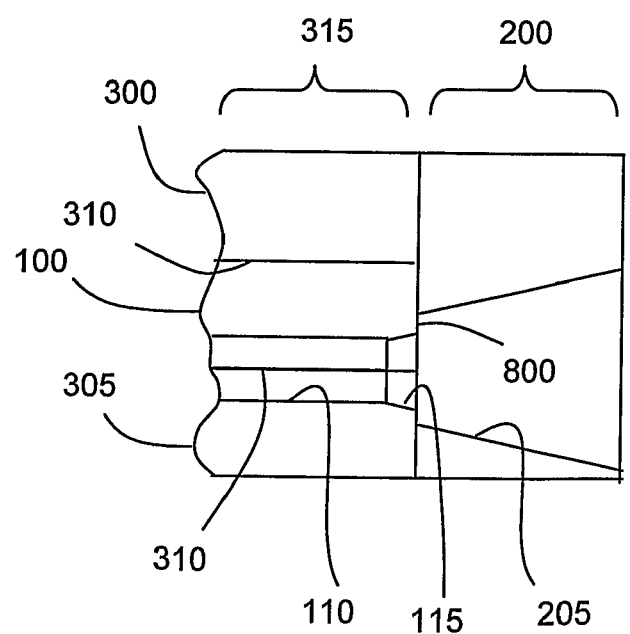
FIG. 9 shows a cross section on the line A-A shown on FIG. 8, viewed in the direction indicated by the arrows.

Referring to FIGS. 8 and 9, the interface at the front face 125 of the waveguide block 315 can be taken advantage of in producing more complex horn designs such as the known 'Potter' or 'mode matched' horn (as would be understood by somebody skilled in the art). For example, if the sizes of the openings of the conical end sections 115 of the feedhorns are different in diameter (for example less) from the openings into the main bodies of the feedhorns 205 in the feedhorn block 200, a shoulder 800 appears at the front face 125 of the waveguide block 315. A step discontinuity 800 of this type, between the main feedhorn taper and the waveguide/taper transition block 315 as shown in FIGS. 8 and 9 allows further second order adjustment of the feedhorn properties to optimise the symmetrical nature of its radiation properties.

It will be understood that the shape of the feedhorn 205 or feedhorns 205 may have other characteristics, such as a flare or additional discontinuities. It is not essential that a feedhorn should have a conical internal profile.

Although other materials might be used, an example that is suitable for both the waveguide block 315 and the feedhorn block 200 is brass. Examples of other suitable materials are other metals, such as gold, an alloy, a metal coated plastic or metal coated semiconductor.

Figure 7:
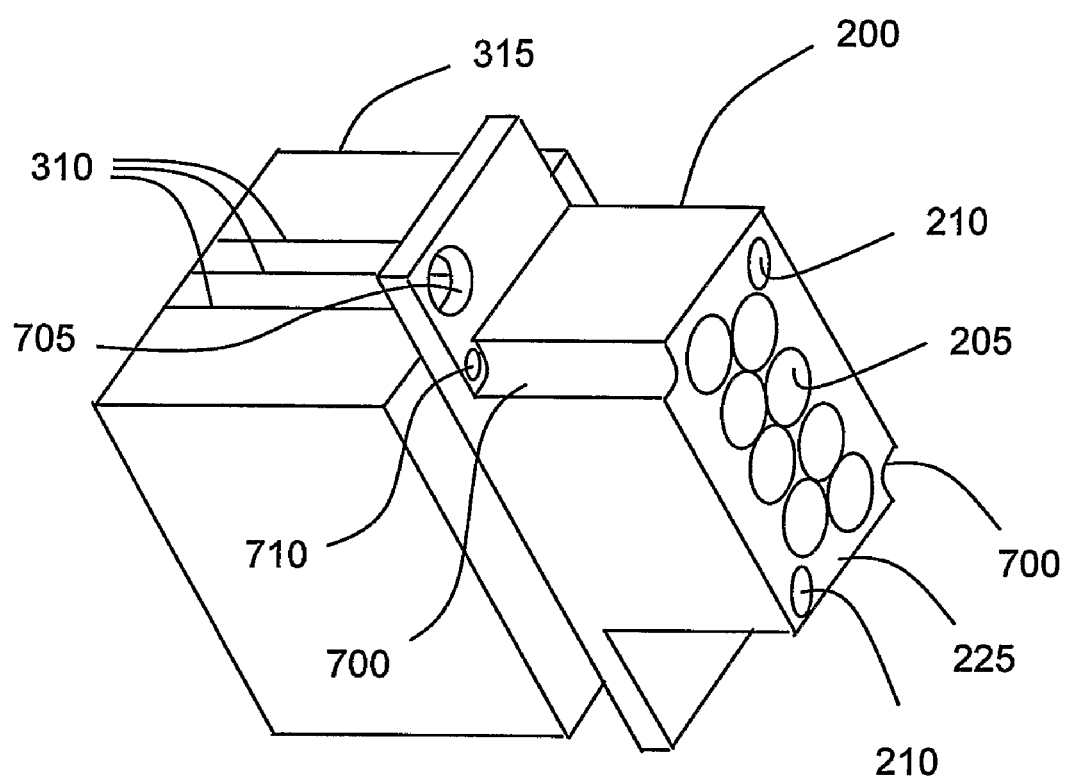
FIG. 7 shows an elevation from below of an arrangement of fixings for aligning the feedhorn block of FIG. 2 with a sandwich construction of the type shown in FIG. 3.

Referring to FIGS. 2 and 7, a method of making and assembling a waveguide/feedhorn assembly 315, 200 is as follows.

A waveguide block 315 is made for example in the way described in co-pending British patent application 0615140.1, filed on 29 Jul. 2006. This shows an array of waveguide openings of the type shown in FIG. 3. (In practice, for the purpose of accommodating connections to the mixer channels "M" and as shown in FIG. 7, this block 315 may be based on four or more substrates with interfaces 310 therebetween.)

For the feedhorn block 200, a generally cuboid block of material such as brass is machined to give a pair of mounting flanges 215 on either side of a flat face 220. The body of the block extends away from that face 220 to a parallel face 225. Diagonally opposed corners 700 of the body of the block are machined away to give access to dowel holes 710. The other two corners of the body of the block have receiving sockets 210 for screws. The flanges 215 are each provided with a mounting hole 705.

To make the feedhorns 205, conical holes are drilled through the body of the feedhorn block 200. These are slightly less in diameter than the intended final size of the feedhorns 205. The feedhorn block 200 is then mounted in relation to the waveguide block 315 by using the holes 705 in the flanges 215 to mount the two blocks together in a frame or housing (not shown). Dowels in the dowel holes 710 provide accurate registration of the conical holes in the feedhorn block 315 with the waveguide openings of the waveguide block 315. It is only at this stage that the conical end sections 115 of the feedhorns 205 are produced in the waveguide openings. This is done by drilling out the conical holes in the body of the feedhorn block 200 to their final size and at the same time penetrating into the waveguide block 315 to create the conical end sections 115 of the feedhorns 205. This technique achieves an array of feedhorns 205 with low losses in spite of the interface between the waveguide block 315 and the feedhorn block 200.

To make the arrangement shown in FIGS. 8 and 9, it is possible to carry out the steps described above and then to disassemble the waveguide block 315 and the feedhorn block 200 to allow further drilling of the main bodies of the feedhorns 205 in the feedhorn block 200. The existing conical holes in the feedhorn block 200 allow accurate positioning of the enlarged holes and the dowels in the dowel holes 710 allow the two blocks 315, 200 to be re-assembled without loss of registration.

Receiving sockets 210 for screws are mentioned above. These support further assembly of the waveguide and feedhorn blocks 315, 200 into finished equipment such as a camera.

Machining and assembly of the waveguide and feedhorn blocks 315, 200 can be done using known techniques such as laser micromachining and/or optically controlled positioning and can generally be achieved to meet a tolerance of not more than 5 microns. Typical return losses between waveguide 110 and feedhorn 205 of better than −27 dB have been achieved in embodiments of the invention.

It is not essential that the waveguides are produced as described above, based on a sandwich construction of layers brought together into register. Any other suitable techniques could be used. The use of preformed feedhorn apertures in a feedhorn block for alignment in drilling end portions of the feedhorns into waveguides for transmitting radiation therebetween in use of an assembly could potentially be useful however the waveguides are fabricated, as is the concept of creating "countersunk" end portions of the feedhorns into waveguide openings to avoid having a material interface right at the junction of the waveguide and feedhorn.

What is claimed is:

1. A waveguide/feedhorn assembly for use in an electromagnetic radiation detector, the assembly comprising:
    a waveguide block comprising a block of material having an opening in a face thereof and having at least part of a waveguide therein and at least an end portion of a feedhorn therein, said end portion of a feedhorn being provided by a machine-formed portion extending into the waveguide block at said opening, the end portion of the feedhorn and the at least part of a waveguide having an integral connecting junction therebetween for delivery of radiation, wherein said at least part of a waveguide has a waveguiding surface whose cross section is at least substantially quadrilateral,
    said end portion of a feedhorn having an internal cross section, transverse to the feed direction of the feedhorn, which is at least substantially rounded, and
    the junction being recessed from said face of the block of material and provided by a continuous surface in the waveguiding direction of the waveguide.

2. A waveguide/feedhorn assembly as in claim 1, the assembly further comprising:
    a feedhorn block having at least part of a feedhorn therein, the feedhorn block being assembled with the waveguide block such that said part of a feedhorn in the feedhorn block communicates with said part of a waveguide in the waveguide block for delivery of radiation therebetween, through said end portion of the feedhorn.

3. A waveguide/feedhorn assembly according to claim 2, wherein:
    the feedhorn has an internal surface provided by (a) the end portion in the waveguide block and (b) the part of the feedhorn in the feedhorn block, and
    the end portion of the feedhorn is dimensioned in relation to said part of a feedhorn to produce a step in the internal surface of the feedhorn.

4. A waveguide/feedhorn assembly according to claim 2, wherein the feedhorn block comprises an array of feedhorn apertures and the block of material of the waveguide block comprises a matching array of openings, each feedhorn aperture communicating with a respective waveguide via one of said openings.

5. A waveguide/feedhorn assembly according to claim 1 wherein the internal cross section of the end portion of the feedhorn is circular.

6. A waveguide/feedhorn assembly according to claim 1, wherein said block of material comprises at least two layers, said part of a waveguide being provided at an interface between the two layers.

7. A waveguide/feedhorn assembly according to claim 6 wherein each of said two layers has a recess therein and said part of a waveguide is provided by the recesses, the recesses being in register in the assembly.

8. A waveguide/feedhorn assembly according to claim 7 wherein said part of a waveguide has a waveguiding surface whose cross section is at least substantially rectangular and the interface between the two layers is present in the longer sides of said cross section.

9. A terahertz radiation detector comprising a waveguide/feedhorn assembly according to claim 1.

10. A waveguide/feedhorn assembly according to claim 1, wherein the block of material has an array of openings in said face, each opening being provided by an end portion of a feedhorn having a junction with at least part of a waveguide, each junction being inset from said face of the block of material.

11. A method of making a waveguide/feedhorn assembly for use in an electromagnetic radiation detector, which method comprises:
  i) making a waveguide block providing at least one waveguide having an opening in a face thereof, said at least one waveguide having a waveguiding surface whose cross-section is at least substantially quadrilateral;
  ii) making a feedhorn block comprising a block of material having at least one feedhorn aperture therethrough;
  iii) assembling the feedhorn block with the waveguide block such that the feedhorn aperture is in registration with the waveguide block opening; and
  iv) making an end portion of a feedhorn in the waveguide block by drilling into the waveguide block at the opening,
whereby said end portion of a feedhorn has an internal cross-section, transverse to the feed direction of the feedhorn, which is at least substantially rounded, and whereby said end portion of a feedhorn and the at least part of a waveguide have a junction therebetween for delivery of radiation, said junction being recessed from said face of the block of material and provided by a continuous surface in the waveguiding direction of the waveguide.

12. A method according to claim 11, wherein the step of making an end portion of a feedhorn comprises aligning said end portion by means of the feedhorn aperture.

13. A method according to claim 11, wherein the step of making an end portion of a feedhorn by drilling further comprises finishing the feedhorn aperture by said drilling to provide an internal surface of the feedhorn for feeding radiation in use of the assembly.

14. A method according to claim 11, wherein the block of material comprises at least two layers, the step of making a waveguide block comprises the steps of creating at least one elongate recess in a surface of a first of said layers and assembling a surface of a second of said layers adjacent said surface of the first layer to provide said at least one waveguide in the block of material.

15. A method according to claim 14 further comprising creating at least one elongate recess of complementary shape in the surface of the second layer, the recesses being brought into register by said step of assembling the surface of the second layer such that the waveguide is provided in part by each of the recesses.

\* \* \* \* \*